(12) United States Patent
Wada et al.

(10) Patent No.: US 11,972,929 B2
(45) Date of Patent: Apr. 30, 2024

(54) PROCESSING APPARATUS AND FILM FORMING METHOD

(71) Applicant: TOKYO ELECTRON LIMITED, Tokyo (JP)

(72) Inventors: Makoto Wada, Yamanashi (JP); Takashi Matsumoto, Yamanashi (JP); Masahito Sugiura, Yamanashi (JP); Ryota Ifuku, Yamanashi (JP); Hirokazu Ueda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/636,808

(22) PCT Filed: Aug. 7, 2020

(86) PCT No.: PCT/JP2020/030346
§ 371 (c)(1),
(2) Date: Feb. 18, 2022

(87) PCT Pub. No.: WO2021/033579
PCT Pub. Date: Feb. 25, 2021

(65) Prior Publication Data
US 2022/0316065 A1 Oct. 6, 2022

(30) Foreign Application Priority Data

Aug. 21, 2019 (JP) ................................ 2019-150865

(51) Int. Cl.
*C23C 16/511* (2006.01)
*C23C 16/27* (2006.01)
(Continued)

(52) U.S. Cl.
CPC ........ *H01J 37/3222* (2013.01); *C23C 16/274* (2013.01); *C23C 16/45557* (2013.01); *C23C 16/511* (2013.01)

(58) Field of Classification Search
None
See application file for complete search history.

(56) References Cited

U.S. PATENT DOCUMENTS

| | | | | |
|---|---|---|---|---|
| 5,270,616 A | * | 12/1993 | Itatani ............... | H01J 37/32266 315/111.21 |
| 6,413,321 B1 | * | 7/2002 | Kim .................... | C23C 16/0209 438/758 |
| 2007/0286965 A1 | * | 12/2007 | Seamons ............. | H01L 21/3146 427/249.1 |

FOREIGN PATENT DOCUMENTS

JP   H10-144667 A      5/1998
JP   H10144667 A  *   5/1998
(Continued)

OTHER PUBLICATIONS

PCT International Search Report and Written Opinion, PCT Application No. PCT/JP2020/030346, dated Oct. 20, 2020, 8 pages (with English translation of PCT International Search Report).

*Primary Examiner* — David P Turocy
(74) *Attorney, Agent, or Firm* — Fenwick & West LLP

(57) ABSTRACT

There is provided a processing apparatus for forming a film with a plasma. The processing apparatus comprises: a processing container, having a ceramic sprayed coating on an inner wall on which an antenna that radiates microwaves is arranged, configured to accommodate a substrate; a mounting table configured to mount the substrate in the processing container; and a controller configured to perform a precoating process of coating a surface of the ceramic sprayed coating with a first carbon film with a plasma of a first carbon-containing gas at a first pressure and a film forming process of forming a second carbon film on the substrate with a plasma of a second carbon-containing gas at a second pressure.

9 Claims, 10 Drawing Sheets

(51) Int. Cl.
*C23C 16/455* (2006.01)
*H01J 37/32* (2006.01)

(56) References Cited

FOREIGN PATENT DOCUMENTS

| | | |
|---|---|---|
| JP | 2009-206164 A | 9/2009 |
| JP | 2014-167142 A | 9/2014 |
| KR | 101041720 B1 * | 6/2011 |
| WO | WO-2013191224 A1 * | 12/2013 ........ H01J 37/32165 |

* cited by examiner

PROCESSING APPARATUS AND FILM FORMING METHOD

TECHNICAL FIELD

The present disclosure relates to a processing apparatus and a film forming method.

BACKGROUND

Conventionally, there is a technology of forming a carbon film on a substrate, which is an object to be processed, by using a plasma chemical vapor deposition (CVD) method.

PRIOR ART DOCUMENTS

Patent Documents

Patent Document 1: Japanese Laid-open Patent Publication No. 2014-167142

SUMMARY

Problems to be Resolved by the Invention

The present disclosure provides a processing apparatus and a film forming method capable of reducing generation of particles.

Means for Solving the Problem

In accordance with an aspect of the present disclosure, a processing apparatus, which is a processing apparatus for forming a film with a plasma, includes a processing container, a mounting table, and a controller. The processing container has a ceramic sprayed coating on an inner wall on which an antenna that radiates microwaves is arranged and accommodates a substrate. The substrate is mounted on the mounting table in the processing container. The controller performs a precoating process of coating a surface of the ceramic sprayed coating with a first carbon film with a plasma of a first carbon-containing gas at a first pressure and performs a film forming process of forming a second carbon film on the substrate with a plasma of a second carbon-containing gas at a second pressure.

Effect of the Invention

According to the present disclosure, generation of particles can be reduced.

DETAILED DESCRIPTION

Hereinafter, embodiments of the disclosed processing apparatus and film forming method will be described in detail with reference to the drawings. The disclosed technology is not limited by the following embodiments.

In a plasma chemical vapor deposition (CVD) method, for example, in a case where a carbon film is formed using a microwave plasma processing apparatus, when a pressure in a chamber as a processing container becomes low, microwave energy may propagate to an inner wall of the chamber, causing damage to the inner wall and causing an abnormal discharge to occur in some cases. As a countermeasure against the propagation of microwave energy to the inner wall of the chamber, the inner wall of the chamber made of aluminum is treated with a ceramic sprayed coating to insulate the inner wall. The ceramic sprayed coating has corrosion resistance to a process gas, but at a low pressure, a plasma potential (Vp) rises and a difference from a floating potential (Vf) becomes large so that it becomes easy for the ceramic sprayed coating to be sputtered. In the vicinity of a plasma source, the ceramic sprayed coating is sputtered and becomes a particle source. Therefore, protecting the ceramic sprayed coating is expected to reduce the generation of particles.

First Embodiment

<Configuration of Processing Apparatus 100>

Figure 1:
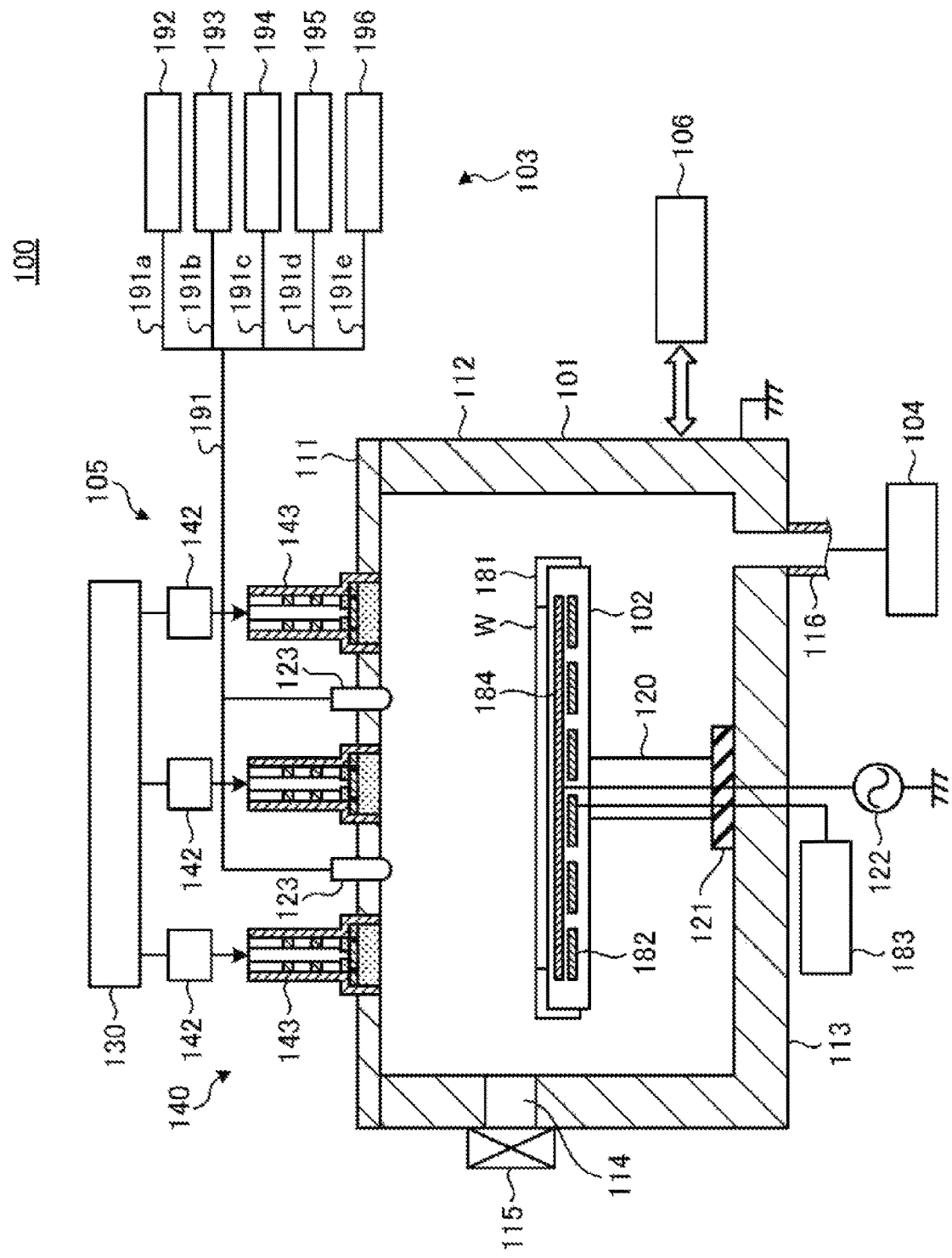
FIG. 1 is a diagram showing an example of a processing apparatus according to a first embodiment of the present disclosure.

FIG. 1 is a diagram showing an example of a processing apparatus according to a first embodiment of the present disclosure. The processing apparatus 100 shown in FIG. 1 includes a processing container 101, a mounting table 102, a gas supply mechanism 103, an exhaust device 104, a microwave introduction device 105, and a controller 106. The processing container 101 accommodates a wafer W. The wafer W is mounted on the mounting table 102. The gas supply mechanism 103 supplies a gas into the processing container 101. The exhaust device 104 exhausts the gas from the processing container 101. The microwave introduction device 105 generates microwaves for generating a plasma in the processing container 101 and also introduces the microwaves into the processing container 101. The controller 106 controls the operation of each element of the processing apparatus 100.

The processing container 101 is formed of a metal material such as aluminum or an alloy thereof, has a substantially cylindrical shape, and has a plate-shaped top wall 111, a bottom wall 113, and a sidewall 112 connecting the two. The microwave introduction device 105 is provided at an upper portion of the processing container 101 and functions as a plasma generator that introduces electromagnetic waves (microwaves) into the processing container 101 to generate a plasma. The microwave introduction device 105 will be described in detail below.

The top wall 111 has a plurality of openings into which a microwave radiation mechanism and a gas introducer, which will be described below, of the microwave introduction device 105 are fitted. The sidewall 112 has a carry-in/out port 114 for carrying the wafer W, which is a substrate to be processed, into or out of a transfer chamber (not shown) adjacent to the processing container 101. The carry-in/out port 114 is opened and closed by a gate valve 115. The exhaust device 104 is provided at the bottom wall 113. The exhaust device 104 is provided at an exhaust pipe 116 connected to the bottom wall 113 and is equipped with a vacuum pump and a pressure control valve. The gas inside the processing container 101 is exhausted through the exhaust pipe 116 by the vacuum pump of the exhaust device 104. The pressure in the processing container 101 is controlled by the pressure control valve.

Inner walls of the top wall 111 and an upper portion of the sidewall 112 are treated with a ceramic sprayed coating and insulated. In the treatment with the ceramic sprayed coating, for example, a ceramic sprayed coating is formed by thermal spray coating using a ceramic such as a metal oxide or a metal nitride. After the spray coating, sintering annealing treatment may be performed. In the first embodiment, for example, yttrium (Y2O3) is used as the ceramic sprayed coating. Examples of other metal oxides include Al2O3, TiO2, SiO2, Cr2O3, ZrO2, and MgO.

Examples of metal nitrides include TiN, TaN, AlN, BN, Si3N4, HfN, and NbN. As the ceramic sprayed coating, metal fluorides, metal carbides, or diamond-like carbon which is an insulator may be used. Examples of metal fluorides include LiF, CaF2, BaF2, and YF3. Examples of metal carbides include SiC, HfC, ZrC, VC, and Cr3C2. The ceramic sprayed coating containing carbon, such as a metal carbide, is excellent in adhesion and consistency with a first carbon film which will be described below. Further, the material of the ceramic sprayed coating may be a combination of the above, and examples thereof include Y2O3F.

The mounting table 102 has a disk shape and is made of a ceramic such as AlN. The mounting table 102 is supported by a support member 120 made of a ceramic such as AlN that has a cylindrical shape and extends upward from the center of the bottom of the processing container 101. A guide ring 181 configured to guide the wafer W is provided on an outer edge of the mounting table 102. Further, inside the mounting table 102, an elevating/lowering pin (not shown) configured to elevate or lower the wafer W is provided to be able to project from or retract into an upper surface of the mounting table 102. Further, a resistance heating type heater 182 is embedded inside the mounting table 102, and the heater 182 heats the wafer W on the mounting table 102 by receiving power from a heater power supply 183. Further, a thermocouple (not shown) is inserted into the mounting table 102, and a heating temperature of the wafer W is able to be controlled to a predetermined temperature in a range of, for example, 300° C. to 1,000° C. on the basis of a signal from the thermocouple. Further, an electrode 184 having the same size as the wafer W is embedded above the heater 182 in the mounting table 102, and a high-frequency bias power supply 122 is electrically connected to the electrode 184. A high-frequency bias for drawing ions is applied from the high-frequency bias power supply 122 to the mounting table 102. The high-frequency bias power supply 122 may not be provided depending on the characteristics of plasma processing.

The gas supply mechanism 103 is for introducing a plasma-generating gas and a raw material gas, which is for forming a carbon film, into the processing container 101 and has a plurality of gas introduction nozzles 123. The gas introduction nozzle 123 is fitted to the opening formed in the top wall 111 of the processing container 101. A gas supply pipe 191 is connected to the gas introduction nozzle 123. The gas supply pipe 191 is branched into five branch pipes 191a, 191b, 191c, 191d, and 191e. An Ar gas supply source 192, an O2 gas supply source 193, a N2 gas supply source 194, a H2 gas supply source 195, and an C2H2 gas supply source 196 are connected to the branch pipes 191a, 191b, 191c, 191d, and 191e. The Ar gas supply source 192 supplies Ar gas as a noble gas which is the plasma-generating gas. The O2 gas supply source 193 supplies O2 gas as an oxidizing gas which is a cleaning gas. The N2 gas supply source 194 supplies N2 gas used as a purge gas or the like. The H2 gas supply source 195 supplies H2 gas as a reducing gas. The C2H2 gas supply source 196 supplies acetylene (C2H2) gas as a carbon-containing gas which is a film-forming raw material gas. The C2H2 gas supply source 196 may supply another carbon-containing gas such as ethylene (C2H4). The carbon-containing gas supplied by the C2H2 gas supply source 196 is a first carbon-containing gas and a second carbon-containing gas which will be described below. That is, in the first embodiment, the same carbon-containing gas is used as the first carbon-containing gas and the second carbon-containing gas. As the first carbon-containing gas and the second carbon-containing gas, different carbon-containing gases such as acetylene and ethylene may also be used.

Although not shown, the branch pipes 191a, 191b, 191c, 191d, and 191e are provided with a mass flow controller for flow rate control and valves disposed in front of and behind the mass flow controller. Also, a shower plate may be provided to supply the C2H2 gas and the H2 gas to a position close to the wafer W to adjust the dissociation of the gases. Further, the same effect may be obtained by extending a nozzle that supplies the gases downward.

As described above, the microwave introduction device 105 is provided above the processing container 101 and functions as a plasma generator that introduces electromagnetic waves (microwaves) into the processing container 101 to generate a plasma.

Figure 2:
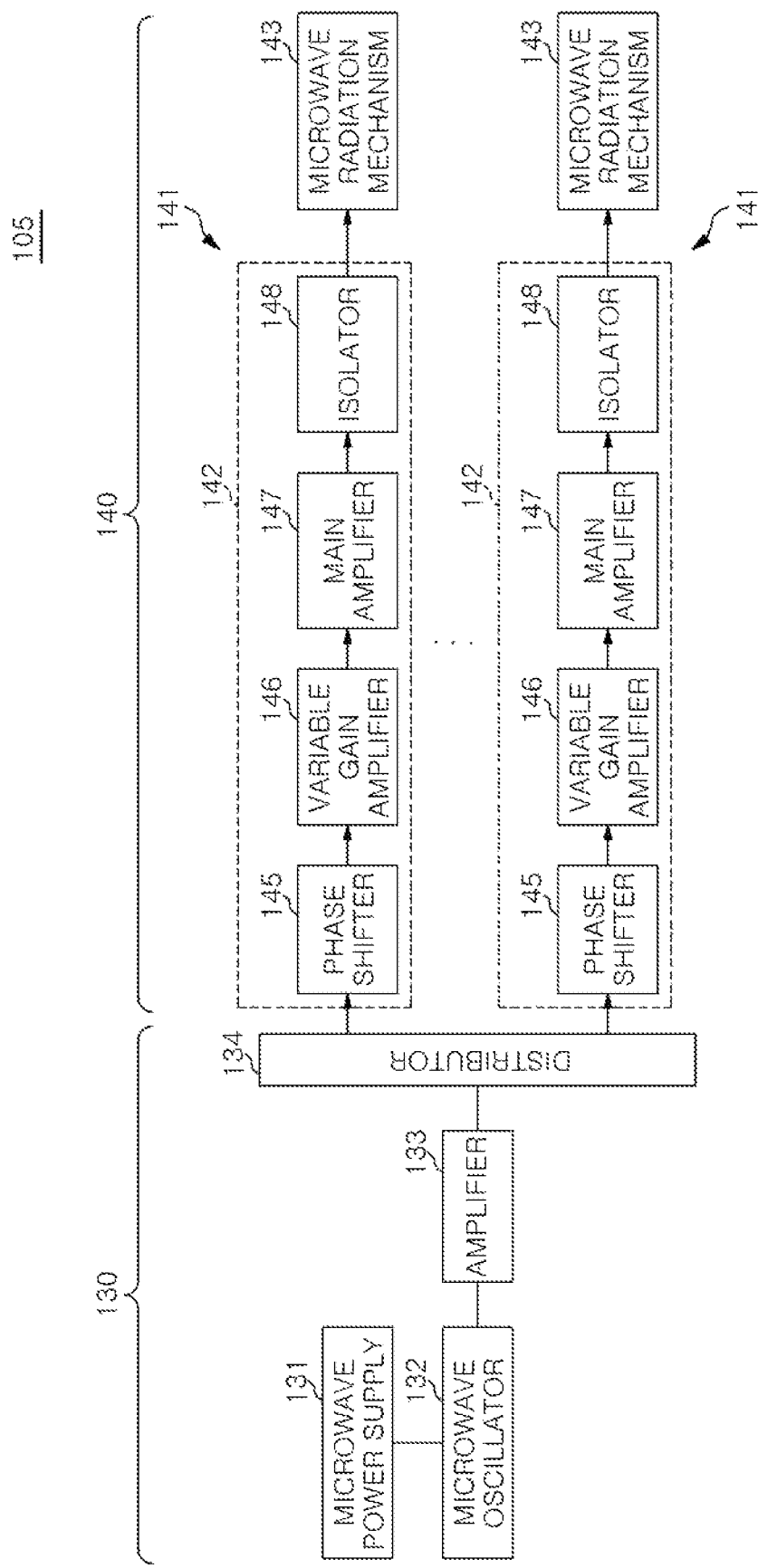
FIG. 2 is a diagram showing an example of a configuration of a microwave introduction device according to the first embodiment.

FIG. 2 is a diagram showing an example of a configuration of a microwave introduction device according to the first embodiment. As illustrated in FIGS. 1 and 2, the microwave introduction device 105 has the top wall 111 of the processing container 101, a microwave outputter 130, and an antenna unit 140. The top wall 111 functions as a top plate. The microwave outputter 130 generates microwaves and distributes the microwaves to a plurality of paths to output the microwaves. The antenna unit 140 introduces the microwaves output from the microwave outputter 130 into the processing container 101.

The microwave outputter 130 includes a microwave power supply 131, a microwave oscillator 132, an amplifier 133, and a distributor 134. The microwave oscillator 132 is in a solid state and causes the oscillation (e.g., phase-locked loop (PLL) oscillation) of microwaves at 860 MHz, for example. The frequency of the microwaves is not limited to 860 MHz and may be any other frequency in a range of 700 MHz to 10 GHz, such as 2.45 GHz, 8.35 GHz, 5.8 GHz, or 1.98 GHz. The amplifier 133 amplifies the microwaves oscillated by the microwave oscillator 132. The distributor 134 distributes the microwaves amplified by the amplifier 133 to the plurality of paths. The distributor 134 distributes the microwaves while matching impedances on an input side and an output side.

The antenna unit 140 includes a plurality of antenna modules 141. Each of the plurality of antenna modules 141 introduces the microwaves distributed by the distributor 134 into the processing container 101. The configurations of the plurality of antenna modules 141 are all the same. Each antenna module 141 has an amplifier 142 configured to mainly amplify and output the distributed microwaves and a microwave radiation mechanism 143 configured to radiate the microwaves output from the amplifier 142 into the processing container 101.

The amplifier 142 has a phase shifter 145, a variable gain amplifier 146, a main amplifier 147, and an isolator 148. The phase shifter 145 changes the phase of the microwaves. The variable gain amplifier 146 adjusts the power level of the microwaves input to the main amplifier 147. The main amplifier 147 is configured as a solid state amplifier. The isolator 148 separates reflected microwaves which are reflected from an antenna of the microwave radiation mechanism 143, which will be described below, toward the main amplifier 147.

Figure 3:
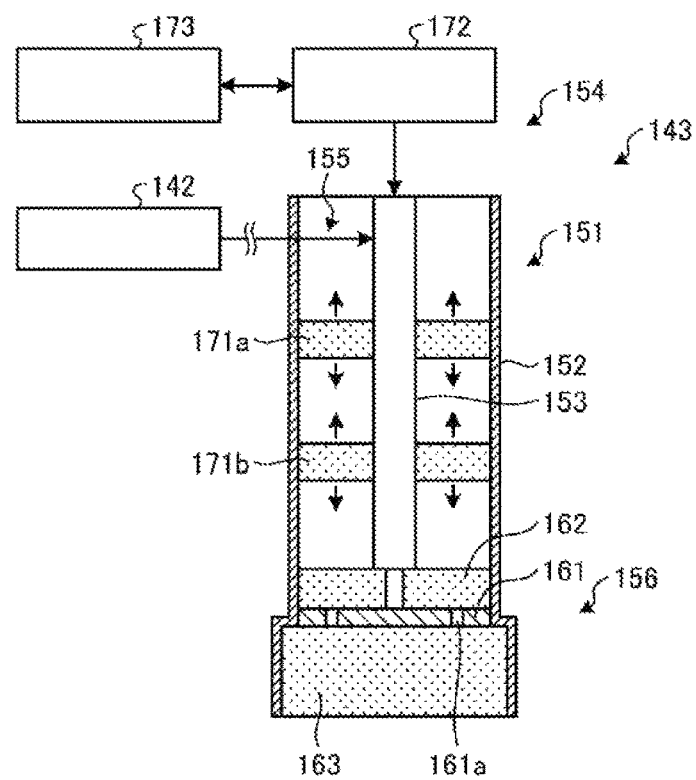
FIG. 3 is a diagram schematically showing an example of a microwave radiation mechanism according to the first embodiment.

Here, the microwave radiation mechanism 143 will be described with reference to FIG. 3. FIG. 3 is a diagram schematically showing an example of a microwave radiation mechanism according to the first embodiment. As shown in FIG. 1, a plurality of microwave radiation mechanisms 143 are provided on the top wall 111. Further, as shown in FIG. 3, the microwave radiation mechanism 143 has a cylindrical outer conductor 152 and an inner conductor 153 provided coaxially with the outer conductor 152 in the outer conductor 152. The microwave radiation mechanism 143 has a coaxial tube 151, which has a microwave transmission path between the outer conductor 152 and the inner conductor 153, a tuner 154, a feeder 155, and an antenna 156. The tuner 154 matches an impedance of a load with a characteristic impedance of the microwave power supply 131. The feeder 155 feeds the amplified microwaves from the amplifier 142 to the microwave transmission path. The antenna 156 radiates the microwaves from the coaxial tube 151 into the processing container 101.

The microwaves amplified by the amplifier 142 are introduced from the side of an upper end portion of the outer conductor 152 into the feeder 155 by a coaxial cable, and for example, the feeder 155 radiates the microwaves with a feeding antenna. Due to this microwave radiation, microwave power is fed to the microwave transmission path between the outer conductor 152 and the inner conductor 153, and the microwave power propagates toward the antenna 156.

The antenna 156 is provided at a lower end portion of the coaxial tube 151. The antenna 156 has a disk-shaped planar antenna 161 connected to a lower end portion of the inner conductor 153, a wave-delaying member 162 arranged on an upper surface side of the planar antenna 161, and a microwave transmission plate 163 arranged on a lower surface side of the planar antenna 161. The microwave transmission plate 163 is fitted in the top wall 111, and a lower surface of the microwave transmission plate 163 is exposed in an inner space of the processing container 101. The planar antenna 161 has a slot 161a formed to penetrate the planar antenna 161. The shape of the slot 161a is appropriately set so that microwaves are efficiently radiated. A dielectric may be inserted into the slot 161a.

The wave-delaying member 162 is made of a material having a dielectric constant larger than that of a vacuum and may, due to its thickness, adjust the phase of microwaves and allow the radiant energy of the microwaves to be maximized. The microwave transmission plate 163 is also made of a dielectric and has a shape that allows microwaves to be efficiently radiated in a transverse electric (TE) mode. The microwaves transmitted through the microwave transmission plate 163 generate a plasma in the space inside the processing container 101. As a material constituting the wave-delaying member 162 and the microwave transmission plate 163, for example, quartz, a ceramic, a fluorine-based resin such as polytetrafluoroethylene resin, a polyimide resin, or the like may be used.

The tuner 154 constitutes a slug tuner. As shown in FIG. 3, the tuner 154 has slugs 171a and 171b, an actuator 172, and a tuner controller 173. The slugs 171a and 171b are two slugs arranged at portions of the coaxial tube 151 that are more proximal than (above) the antenna 156. The actuator 172 drives these two slugs independently. The tuner controller 173 controls the actuator 172.

The slugs 171a and 171b are plate-shaped and annular, are made of a dielectric material such as a ceramic, and are arranged between the outer conductor 152 and the inner conductor 153 of the coaxial tube 151. Further, for example, the actuator 172 individually drives the slugs 171a and 171b by rotating two screws which are provided inside the inner conductor 153 and to which each of the slugs 171a and 171b are coupled. Then, on the basis of a command from the tuner controller 173, the actuator 172 causes the slugs 171a and 171b to move in the vertical direction. The tuner controller 173 adjusts the positions of the slugs 171a and 171b so that an impedance of a terminal becomes 50Ω.

The main amplifier 147, the tuner 154, and the planar antenna 161 are arranged in close proximity to each other. The tuner 154 and the planar antenna 161 constitute a lumped constant circuit and function as a resonator. Impedance mismatch is present in a mounting portion of the planar antenna 161. However, since the tuner 154 tunes directly to a plasma load, it is possible to tune with high precision by including the plasma, and it is possible to eliminate the influence of reflection on the planar antenna 161.

Figure 4:
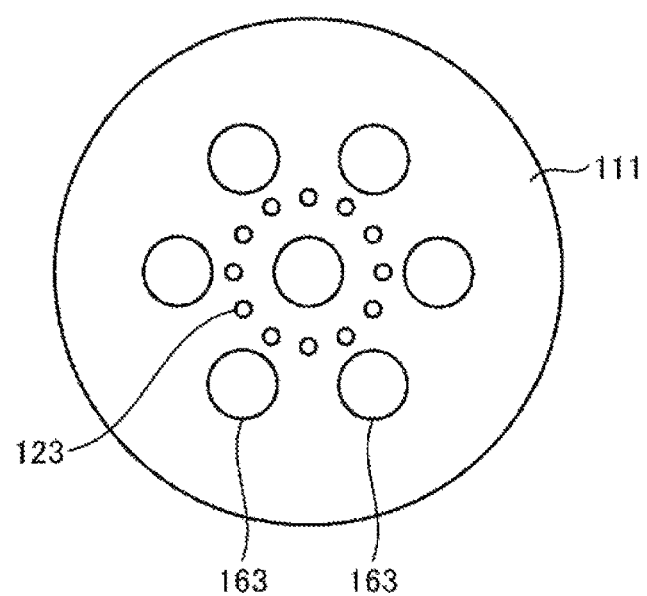
FIG. 4 is a diagram schematically showing an example of a top wall of a processing container according to the first embodiment.

As shown in FIG. 4, in the first embodiment, seven microwave radiation mechanisms 143 are provided, and seven microwave transmission plates 163 that correspond thereto are evenly arranged in a hexagonal closed-packed arrangement. That is, one of the seven microwave transmission plates 163 is arranged in the center of the top wall 111, and the other six microwave transmission plates 163 are arranged around the center. These seven microwave transmission plates 163 are arranged so that the adjacent microwave transmission plates 163 are evenly spaced. Further, the plurality of gas introduction nozzles 123 of the gas supply mechanism 103 are arranged to surround the periphery of the microwave transmission plate 163 at the center. The number of microwave radiation mechanisms 143 is not limited to seven.

The controller 106 is typically formed of a computer and controls each element of the processing apparatus 100. The controller 106 is equipped with a storage unit configured to store process recipes, which are process sequences and control parameters of the processing apparatus 100, an input means, a display, or the like and is able to perform predetermined control according to a selected process recipe.

For example, the controller 106 controls each element of the processing apparatus 100 to perform a film forming method which will be described below. In a detailed example, the controller 106 performs a precoating process of coating a surface of the ceramic sprayed coating on the inner wall of the processing apparatus 101 with the first carbon film by the plasma of the first carbon-containing gas at a first pressure in the state where a substrate (the wafer W) is not carried into the processing container 101. The controller 106 performs a mounting process of mounting the substrate on the mounting table 102 in the processing container 101. The controller 106 performs a film forming process of forming a second carbon film on the substrate by the plasma of the second carbon-containing gas at a second pressure. Here, as the first carbon-containing gas and the second carbon-containing gas, acetylene (C2H2) gas supplied from the C2H2 gas supply source 196 may be used. As the first carbon-containing gas and the second carbon-containing gas, ethylene (C2H4) gas or the like may be used. The first pressure is, for example, 2 Torr, and the second pressure is, for example, 50 mTorr.

<Ceramic Sprayed Coating>

Figure 5:
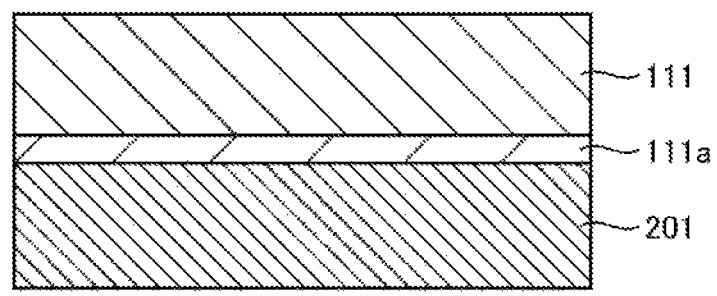
FIG. 5 is a diagram showing an example of a ceramic sprayed coating according to the first embodiment.

FIG. 5 is a diagram showing an example of a ceramic sprayed coating according to the first embodiment. As shown in FIG. 5, on the surface of the processing container 101, e.g., the surface of the top wall 111, an oxide film 111a of Al2O3 is formed for Al which is a base material. A ceramic sprayed coating 201 is formed on the oxide film 111a by thermal spray coating. As described above, the ceramic sprayed coating 201 is a sprayed coating of an oxide or a nitride of a metal such as yttrium.

First, the ceramic sprayed coating 201 is preprocessed for surface normalization and stabilization. For example, the preprocessing is performed by supplying a gas, which contains one or more of hydrogen and a noble gas, as a plasma-generating gas (a discharge gas) to the processing container 101 to ignite the plasma. As the noble gas, for example, Ar is used. The processing temperature or plasma power is appropriately changed according to the state of the substrate. Further, in the preprocessing, the plasma may not be ignited, and a mixed gas, which contains one or more of hydrogen and a noble gas, may be supplied to the processing container 101 to perform annealing treatment.

Further, the preprocessing is performed by supplying a mixed gas, which contains oxygen or nitrogen and a noble gas, as a plasma-generating gas (a discharge gas) to the processing container 101 to ignite the plasma. As the noble gas, for example, Ar is used. By performing plasma processing with the mixed gas containing oxygen or nitrogen, stabilized termination of oxygen or nitrogen is performed on variation points where an oxidation state or a nitriding state of the ceramic sprayed coating 201 is incomplete. The plasma processing in the preprocessing may be performed as a continuous process or may be divided into a plurality of times as in pulse processing. Further, by changing the pressure in the processing container 101 to control the spread of the plasma, the effect of the preprocessing may be spread over the entire processing container 101.

<Coating with First Carbon Film>

Figure 6:
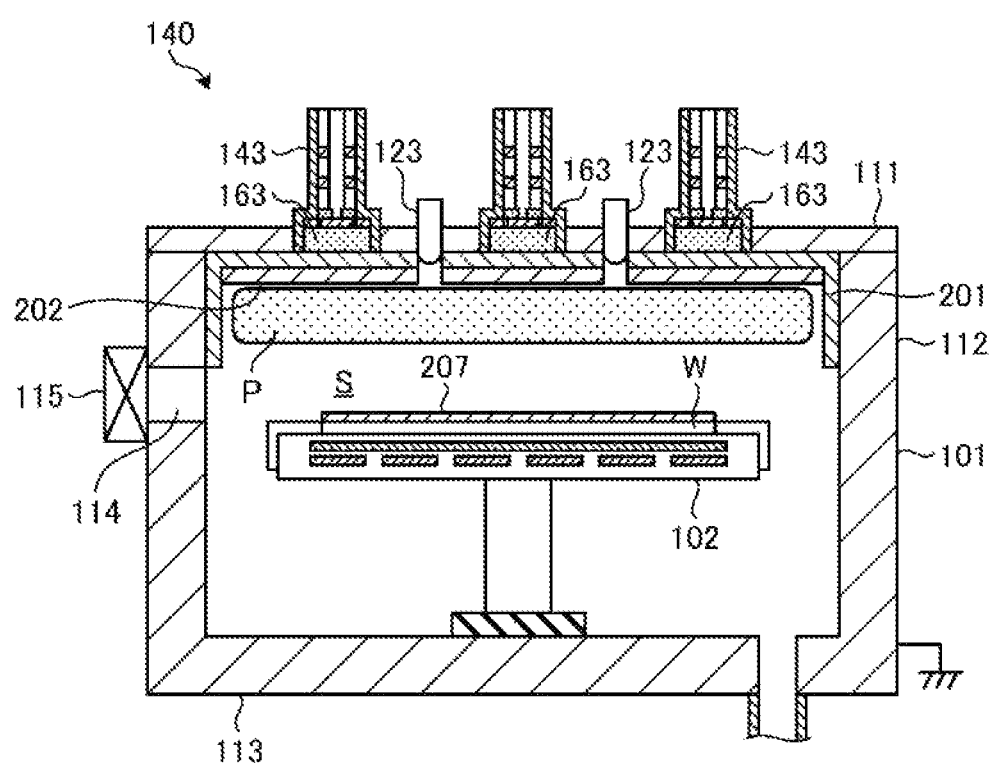
FIG. 6 is a diagram showing an example of the ceramic sprayed coating and a coating position of a first carbon film according to the first embodiment.

FIG. 6 is a diagram showing an example of the ceramic sprayed coating and a coating position of a first carbon film according to the first embodiment. As shown in FIG. 6, the ceramic sprayed coating 201 is formed on the inner walls of the top wall 111 and the upper portion of the sidewall 112. The processing apparatus 100 reduces the pressure in the processing container 101 to the first pressure and supplies the first carbon-containing gas as a plasma-generating gas from the gas introduction nozzle 123 into the processing container 101 to ignite the plasma. The first pressure is, for example, 2 Torr, which is higher than the second pressure (for example, 50 mTorr) in a case where a second carbon film 207 is formed on the wafer W mounted on the mounting table 102. Therefore, as shown in FIG. 6, in a space S of the processing container 101, a high-density plasma P is formed in the vicinity of the microwave transmission plate 163 which is a plasma source. That is, the plasma P stands in a region directly below the top wall 111. In this state, the inner walls of the top wall 111 and the upper portion of the sidewall 112 may be coated with a first carbon film 202. When the pressure in the processing container 101 is lowered, the plasma P spreads toward the mounting table 102, and when the pressure is raised, the plasma P narrows toward the top wall 111. In the following description, such a process of coating with the first carbon film 202 will be referred to as a precoating process. In FIG. 6, for the sake of simplicity, the first carbon film 202 with which the inner wall of the upper portion of the sidewall 112 is coated is omitted, and only the first carbon film 202 with which the top wall 111 is coated is shown. Further, although the second carbon film 207 is not formed in the precoating process, FIG. 6 schematically shows a place where the second carbon film 207 is formed in the film forming process.

In the processing container 101, at the first pressure, most of the microwave energy is used to excite the plasma-generating gas supplied at high density. That is, at the first pressure, most of the microwave energy is absorbed in the plasma P which is a high-density plasma. Further, when the pressure in the processing container 101 is increased, a plasma potential (Vp) of the plasma P decreases and the difference from a floating potential (Vf) becomes small, and the plasma potential decreases, such that plasma damage may be suppressed. Therefore, the ceramic sprayed coating 201 may be coated with the first carbon film 202 without causing plasma damage to the ceramic sprayed coating 201 and causing the generation of particles. A coating range of the first carbon film 202 may be expanded to the lower portion of the processing container 101 by lowering the pressure of the plasma-generating gas and may be narrowed to the upper portion of the processing container 101 by raising the pressure of the plasma-generating gas. Further, in the precoating process, the temperature of a wall surface of the processing container 101 may be raised by using a temperature adjusting mechanism of the top wall 111 or the like. By raising the temperature of the top wall 111 or the like, a more stably bonded carbon film may be coated (formed).

Figure 7:
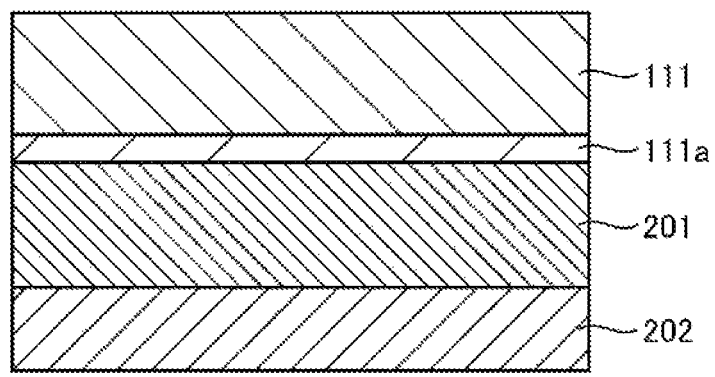
FIG. 7 is a diagram showing an example of the ceramic sprayed coating and the first carbon film according to the first embodiment.

FIG. 7 is a diagram showing an example of the ceramic sprayed coating and the first carbon film according to the first embodiment. As shown in FIG. 7, as in FIG. 5, the oxide film 111a is formed on the surface of the processing container 101, e.g., the surface of the top wall 111, and the ceramic sprayed coating 201 is formed on the oxide film 111a. The first carbon film 202 is coated on the ceramic sprayed coating 201 in the precoating process. The first carbon film 202 is, for example, a carbon film containing one or more of a graphene film, an amorphous carbon film, and a diamond-like carbon film. The first carbon film 202 protects the ceramic sprayed coating 201 in the film forming process of forming the second carbon film 207 on the wafer W. That is, the first carbon film 202 becomes a sacrificial film.

In the precoating process, when hydrogen gas is added to the first carbon-containing gas, since the hydrogen gas contributes as an etching component when coating the first carbon film 202, an unstable carbon bond of the bond may be etched to stabilize the structure of the first carbon film 202. Further, in the precoating process, when nitrogen gas is added to the first carbon-containing gas, nitrogen may be added to the first carbon film 202 and improve the insulating property of the first carbon film 202. The amount of nitrogen added is preferably about 10 times that of a carbon source in the first carbon-containing gas. When the insulating property of the first carbon film 202 is improved, since the floating potential (Vf) of the top wall 111 increases, the difference from the plasma potential (Vp) becomes small, and plasma damage to the top wall 111 may be reduced. That is, the generation of particles may be suppressed.

Further, after the coating (forming) of the first carbon film 202 is completed, annealing treatment may be performed to stabilize and sinter the first carbon film 202. In the annealing treatment, in order to efficiently transfer heat from the mounting table 102, the pressure in the processing container 101 is set to a high pressure condition such as 1 Torr. Further, the annealing treatment is performed in an argon (Ar) single gas atmosphere, a nitrogen (N2) single gas atmosphere, an Ar—N2 atmosphere, or the like. By performing the annealing treatment, a non-uniform portion of the first carbon film 202 where the bond is weak is removed. Further, in a case where the annealing treatment is performed in an atmosphere containing nitrogen, nitrogen termination may be imparted to the first carbon film 202, which may contribute to the improvement of the insulating property. In the precoating process, the wafer W is not mounted on the mounting table 102, but a dummy substrate may be mounted thereon to prevent falling of particles and carbon film deposition on the surface of the mounting table 102.

<Film Forming Method>

Figure 8:
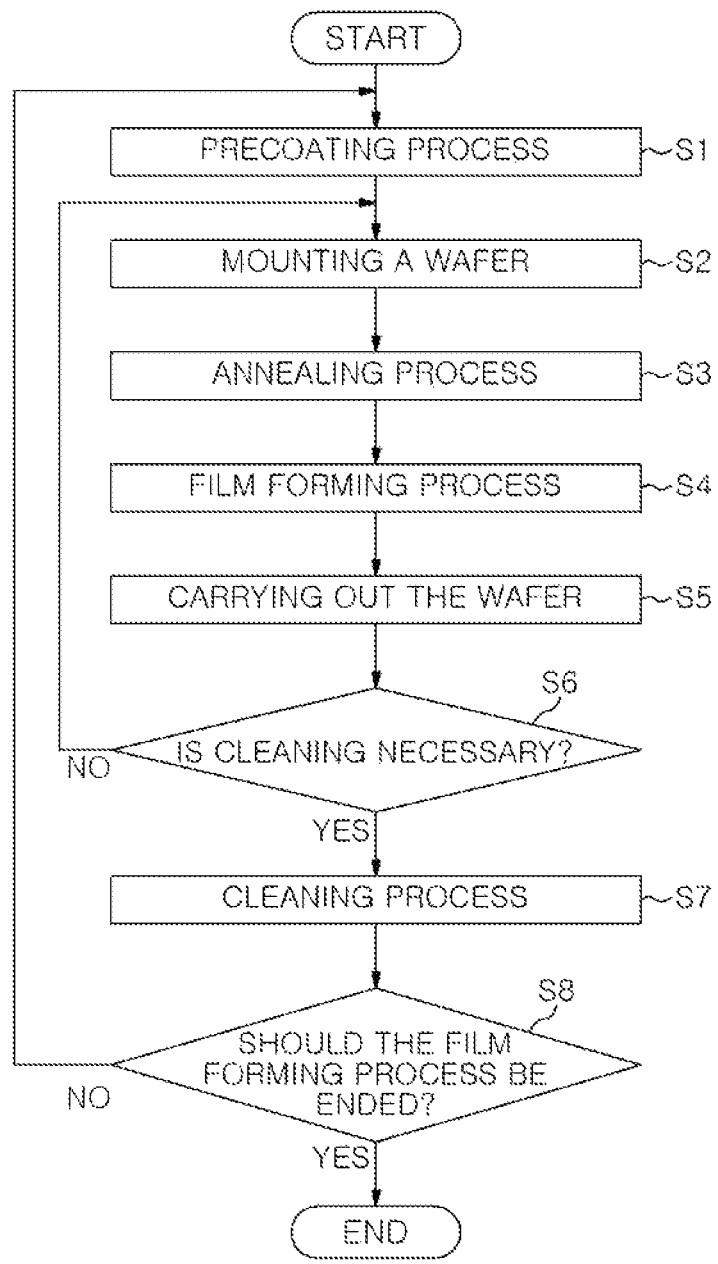
FIG. 8 is a flowchart showing an example of a film forming process according to the first embodiment.

Next, a film forming method according to the first embodiment will be described. FIG. 8 is a flowchart showing an example of a film forming process according to the first embodiment.

In the film forming method according to the first embodiment, first, the controller 106 performs the precoating process (step S1). In the precoating process, the controller 106 reduces the pressure in the processing container 101 to the first pressure (for example, 2 Torr) in a state where the wafer W is not carried into the processing container 101. The controller 106 supplies Ar gas, which is a plasma-generating gas, from the gas introduction nozzle 123 to directly below the top wall 111 of the processing container 101. Further, the controller 106 guides the microwaves distributed into a plurality of pieces and output from the microwave outputter 130 of the microwave introduction device 105 to the plurality of antenna modules 141 of the antenna unit 140 and radiates the microwaves from the microwave radiation mechanisms 143 to ignite the plasma.

In each antenna module 141, the microwaves are individually amplified by the main amplifier 147 constituting the solid state amplifier, are fed to each microwave radiation mechanism 143, and are transmitted through the coaxial tube 151 to reach the antenna 156. At that time, the impedance of the microwaves is automatically matched by the slug 171a and the slug 171b of the tuner 154, and in a state where there is substantially no power reflection, the microwaves are radiated from the slot 161a of the planar antenna 161 through the wave-delaying member 162 of the antenna 156 from the tuner 154. The microwaves further pass through the microwave transmission plate 163 and are transmitted through a surface (lower surface) of the microwave transmission plate 163 in contact with the plasma to form surface waves. Then, the power from each antenna 156 is spatially synthesized in the processing container 101, the surface wave plasma from Ar gas is generated in a region directly below the top wall 111, and that region becomes a plasma generating region.

The controller 106 supplies the first carbon-containing gas from the gas introduction nozzle 123 at a timing when the plasma is ignited. The gas is excited by the plasma and dissociated and is supplied to the inner walls of the top wall 111 and the upper portion of the sidewall 112. The inner walls of the top wall 111 and the upper portion of the sidewall 112 are coated with the first carbon film 202.

Next, the controller 106 mounts the wafer W on the mounting table 102 in the processing container 101 (step S2). The controller 106 sets the pressure in the processing container 101 as, for example, 400 mTorr and supplies a gas, such as a mixed gas of Ar and N2 or a mixed gas of Ar and H2, into the processing container 101 to perform annealing treatment (process) on the surface of the wafer W (step S3). The surface of the wafer W is cleaned and activated by the annealing treatment.

Subsequently, the controller 106 performs the film forming process (step S4). The controller 106 reduces the pressure in the processing container 101 to the second pressure (for example, 50 mTorr). As in the precoating process, the controller 106 supplies Ar gas, which is a plasma-generating gas, from the gas introduction nozzle 123 to directly below the top wall 111 of the processing container 101 and controls the microwave introduction device 105 to ignite the plasma. The controller 106 supplies the second carbon-containing gas from the gas introduction nozzle 123 at a timing when the plasma is ignited. The gas is excited by the plasma and dissociated, radicals from which ions and electrons have been removed are supplied to the wafer W, and the second carbon film 207 (graphene film) is formed on the wafer W. The upper limit of the processing temperature at the time of film formation is about 900° C., and the lower limit thereof is about 300° C. The processing temperature for forming the graphene film is lower than or equal to a temperature in a wiring process of a typical semiconductor device.

Further, in the film forming process, when H2 is added to the second carbon-containing gas or plasma-generating gas, the H2 contributes as an etching component for graphene. By adding the etching component in this way, local nucleation of the second carbon film 207 on the wafer W is suppressed and the horizontal growth is promoted, thus expanding a graphene domain. Further, when H2 is added to the second carbon-containing gas or plasma-generating gas, the first carbon film 202 in the processing container 101 is also etched and recessed. At this time, a portion of the etched carbon is exhausted from inside the processing container 101 by the exhaust device 104, and the rest is dissociated into the carbon source. Thus, the etched carbon is consumed as a carbon film forming component instead of becoming particles. The etched carbon does not affect the film quality of the second carbon film 207 formed on the wafer W. Further, regarding the number of graphene layers formed in the film forming process, a structure of an ultrathin film in which about one layer to several tens of layers are laminated is formed, and thus the graphene film has excellent uniformity.

When the film forming process is completed, the controller 106 carries the wafer W out of the processing container 101 (step S5). The controller 106 determines whether it is necessary to clean the inside of the processing container (step S6). For example, the controller 106 determines whether the number of wafers W processed in the processing container 101 after cleaning has reached a predetermined value. In a case where the controller 106 determines that there is no need to clean the inside of the processing container 101 (step S6: No), the controller 106 returns to step S2, mounts the next wafer W, and performs the annealing process and the film forming process.

In a case where the controller 106 determines that there is a need to clean the inside of the processing container 101 (step S6: Yes), the controller 106 performs a cleaning process of cleaning the inside of the processing container 101 (step S7). In the cleaning process, a cleaning gas is supplied into the processing container 101, and the inside of the processing container 101 is cleaned.

The controller 106 determines whether to end the film forming process following the cleaning process (step S8). In a case where the controller 106 determines not to end the film forming process (step S8: No), the controller 106 returns to step S1 and performs the precoating process. Meanwhile, in a case where the controller 106 determines to end the film forming process (step S8: Yes), the controller 106 ends the film forming process.

Second Embodiment

Figure 9:
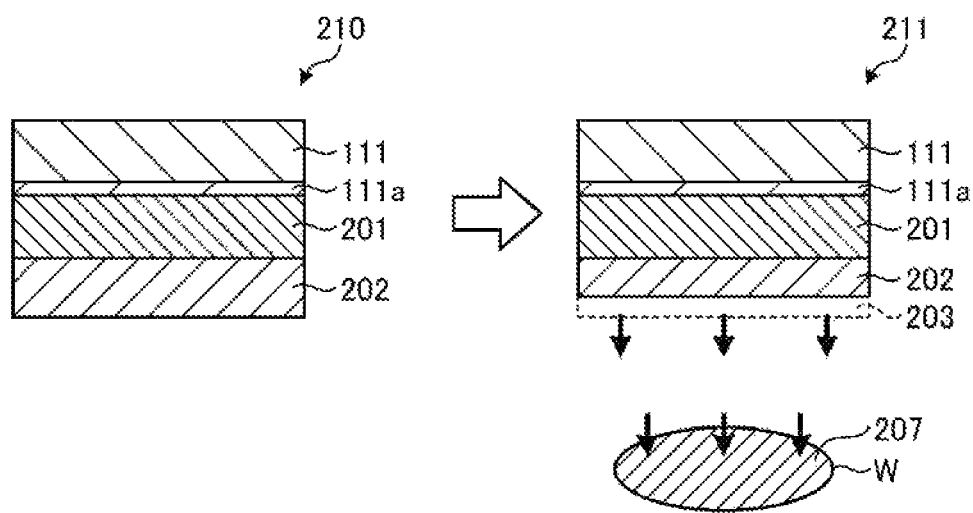
FIG. 9 is a diagram schematically illustrating a recess of the first carbon film according to the first embodiment.
Figure 10:
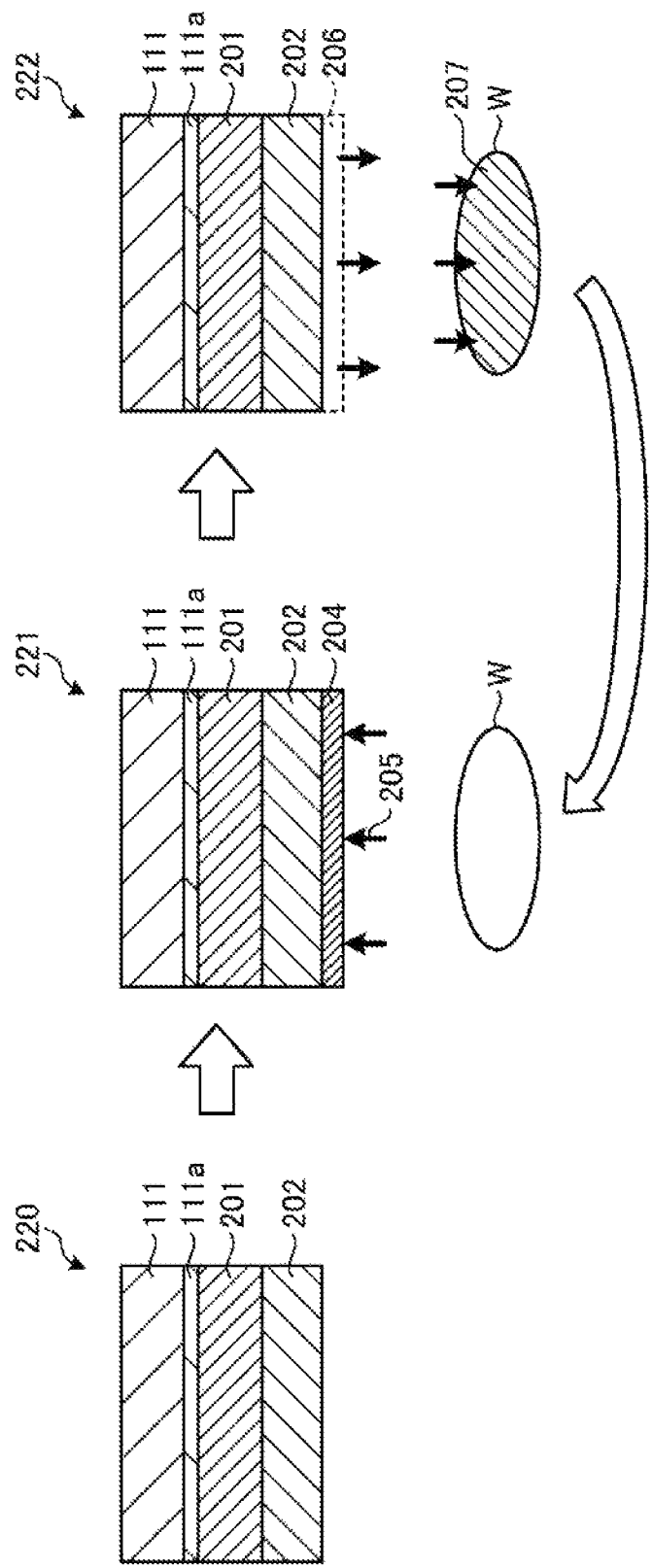
FIG. 10 is a diagram schematically illustrating a supplement and a recess of a first carbon film according to a second embodiment.

In the first embodiment described above, in the precoating process, after a predetermined number of wafers W are processed, the ceramic sprayed coating 201 is coated with the first carbon film 202. However, the first carbon film 202 may be recoated each time the wafer W is processed. First, the recess of the first carbon film 202 in the first embodiment and the second embodiment will be described with reference to FIGS. 9 and 10. FIG. 9 is a diagram schematically illustrating the recess of the first carbon film according to the first embodiment. FIG. 10 is a diagram schematically illustrating a supplement and a recess of a first carbon film according to the second embodiment. Since the configuration of the processing apparatus 100 according to the second embodiment is the same as that according to the first embodiment, the description thereof will be omitted.

As shown in FIG. 9, in the first embodiment described above, the first carbon film 202 shown in a state 210 is etched at the time of graphene film formation as shown in a state 211, and only a region 203 is recessed. A portion of the carbon film of the etched region 203 is exhausted from inside the processing container 101 by the exhaust device 104, and the rest is dissociated into the carbon resource and becomes a film forming component of the second carbon film 207 (graphene film) on the wafer W instead of becoming particles. Since the film thickness of the first carbon film 202 is reduced by this etching reaction, the particle suppression effect of the first carbon film 202 is reduced as wafers are continuously processed with a graphene film. Further, regarding the film formation of the second carbon film 207 on the wafer W, since the first carbon film 202 consumed as the raw material gas is reduced, the film thickness of the second carbon film 207 or the degree of variation in the film thickness changes. Therefore, in the second embodiment, the film thickness or the like may be made constant by, on the first carbon film 202 coated in the precoating process, further adding a carbon film by recoating the carbon film each time the wafer W is processed.

As shown in FIG. 10, in the second embodiment, from a state 220 in which the first carbon film 202 is coated, as shown in a state 221, an additional carbon film 204 is further coated. In the state 221, carbon 205 is supplied to the inner walls of the top wall 111 and the upper portion of the sidewall 112 by the plasma of the first carbon-containing gas at the first pressure, and the additional carbon film 204 is coated. The additional carbon film 204 may be substantially regarded as causing the first carbon film 202 to have a thicker film thickness. Further, in the state 221, the plasma is concentrated in the region directly below the top wall 111, like the plasma P of FIG. 6. Thus, the second carbon film 207 (graphene film) is not formed on the wafer W.

In a state 222 at the time of forming the graphene film on the wafer W, the second carbon film 207 (graphene film) is formed on the wafer W by the plasma of the second carbon-containing gas at the second pressure. At this time, the additional carbon film 204 is etched, and only a region 206 is recessed. A portion of the carbon film of the etched region 206 is exhausted from inside the processing container 101 by the exhaust device 104, and the rest is dissociated into the carbon resource and becomes a film forming component of the second carbon film 207 on the wafer W instead of becoming particles. Then, before the second carbon film 207 is formed on the next wafer W, the first carbon film 202 is coated with the additional carbon film 204 again as shown in the state 221. Therefore, even when the state 221 and the state 222 are repeated, the combined film thickness of the first carbon film 202 and the additional carbon film 204 may be kept constant at the start of graphene film formation. That is, the additional carbon film 204 corresponds to the amount to be etched at the time of graphene film formation. In this way, in the second embodiment, even when the graphene film is continuously formed on the wafers W, a continuous particle suppression effect may be obtained. Further, stable film thickness reproducibility may be obtained for the second carbon film 207 formed on the wafer W.

<Film Forming Method According to Second Embodiment>

Figure 11:
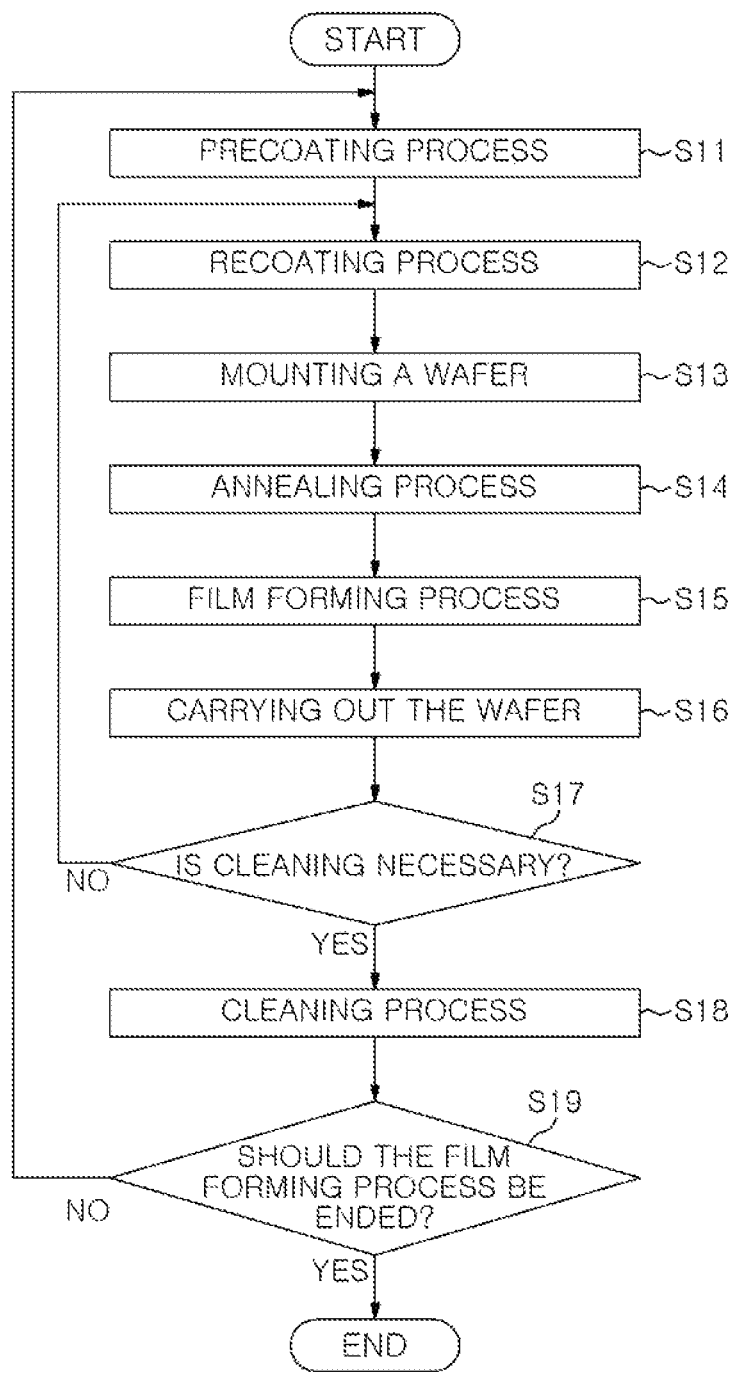
FIG. 11 is a flowchart showing an example of a film forming process according to the second embodiment.

Next, a film forming method according to the second embodiment will be described. FIG. 11 is a flowchart showing an example of a film forming process according to the second embodiment.

In the film forming method according to the second embodiment, first, the controller 106 performs the precoating process (step S11). In the precoating process, as in the first embodiment, the controller 106 reduces the pressure in the processing container 101 to the first pressure (for example, 2 Torr) in the state where the wafer W is not carried into the processing container 101. The controller 106 ignites the plasma to supply the first carbon-containing gas. The gas is excited by the plasma, dissociated, and supplied to the inner walls of the top wall 111 and the upper portion of the sidewall 112. The inner walls of the top wall 111 and the upper portion of the sidewall 112 are coated with the first carbon film 202.

Next, the controller 106 performs a recoating process (step S12). In the recoating process, as in the precoating process, the pressure in the processing container 101 is reduced to the first pressure, and the plasma is ignited to supply the first carbon-containing gas. In this way, the first carbon film 202 is coated with the additional carbon film 204. In the recoating process performed for the first time, the time during which the precoating process is performed may be lengthened to coat the first carbon film 202 having a film thickness including a film thickness of the additional carbon film 204.

Next, the controller 106 mounts the wafer W on the mounting table 102 in the processing container 101 (step S13). The controller 106 sets the pressure in the processing container 101 as, for example, 400 mTorr and performs annealing treatment (process) on the surface of the wafer W in an Ar—N2 atmosphere or the like (step S14). The surface of the wafer W is cleaned and activated by the annealing treatment.

Subsequently, the controller 106 performs the film forming process (step S15). As in the first embodiment, the controller 106 reduces the pressure in the processing container 101 to the second pressure (for example, 50 mTorr) and ignites the plasma to supply the second carbon-containing gas. The gas is excited by the plasma and dissociated, radicals from which ions and electrons have been removed are supplied to the wafer W, the second carbon film 207 is formed on the wafer W, and thus a graphene film is formed.

When the film forming process is completed, the controller 106 carries the wafer W out of the processing container 101 (step S16). The controller 106 determines whether it is necessary to clean the inside of the processing container (step S17). In a case where the controller 106 determines that there is no need to clean the inside of the processing container 101 (step S17: No), the controller 106 returns to step S12 and performs the recoating process. In a case where the controller 106 determines that there is a need to clean the inside of the processing container 101 (step S17: Yes), the controller 106 performs a cleaning process of cleaning the inside of the processing container 101 (step S18). In the cleaning process, a cleaning gas is supplied into the processing container 101, and the inside of the processing container 101 is cleaned.

The controller 106 determines whether to end the film forming process following the cleaning process (step S19). In a case where the controller 106 determines not to end the film forming process (step S19: No), the controller 106 returns to step S11 and performs the precoating process. In a case where the controller 106 determines to end the film forming process (step S19: Yes), the controller 106 ends the film forming process. As a result, stable particle suppression and film thickness control of the second carbon film 207 (graphene film) on the wafer W may be performed. In addition, processing throughput of the wafer W may be improved.

In the second embodiment, the wafer W is mounted after the recoating process, but since formation of the second carbon film 207 on the wafer W is not performed in the recoating process, the wafer W may be mounted before the recoating process, and then the recoating process may be performed. Likewise, in the first embodiment, in a state where the wafer W is mounted, the precoating process and the film forming process may be performed as a series of processes. As a result, the transfer time of the wafer W may be shortened, and thus productivity may be improved.

In the second embodiment, the cleaning process is performed every time a predetermined number of wafers W are processed, but the cleaning process may be performed every time a wafer W is processed. At that time, only the additional carbon film 204, with which the first carbon film 202 is coated, may be removed. Further, in the second embodiment, the recoating process is performed every time a wafer W is processed, but the recoating process may be performed every time a plurality of wafers W are processed. For example, after processing of one lot of wafers W is completed, the recoating process is performed to replenish the first carbon film 202 consumed during the processing of one lot of the wafers W.

<Experimental Result>

Figure 12:
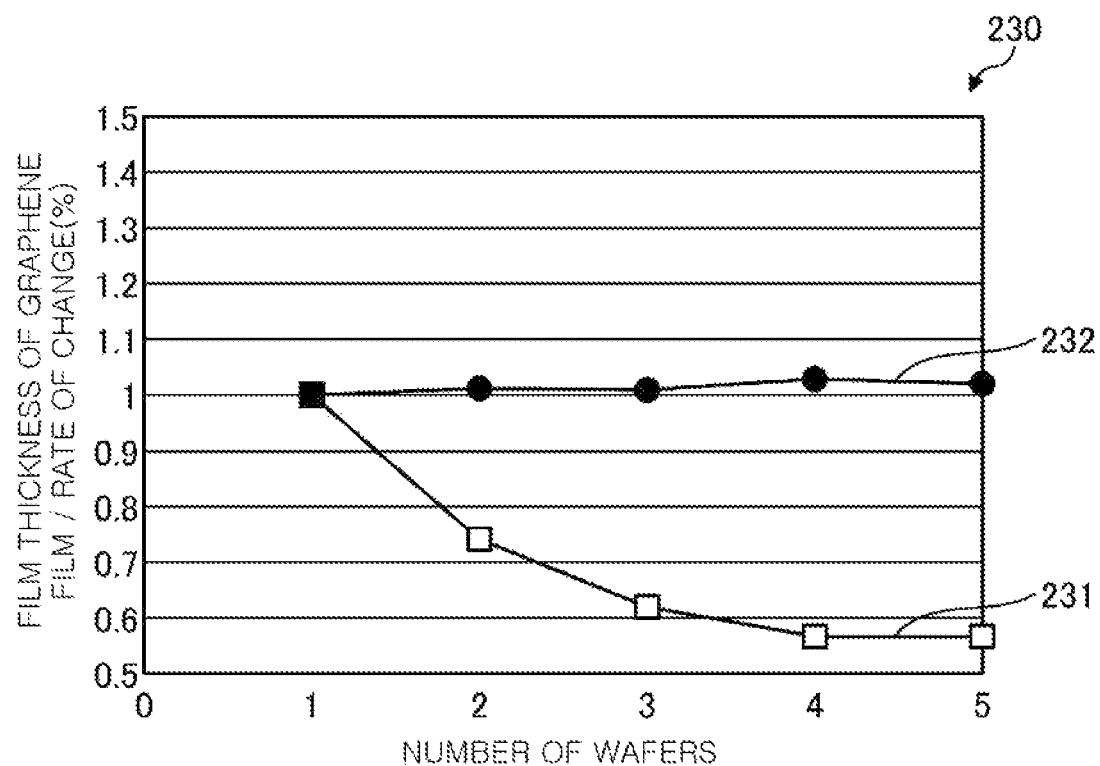
FIG. 12 is a graph showing an example of a rate of change in a film thickness of a graphene film formed on a wafer in a case where there is no recoating process and in a case where there is a recoating process as in the second embodiment.

An experiment was conducted on a change in the film thickness of the second carbon film 207 (graphene film) in a case where the recoating process was applied for each wafer as in the second embodiment. FIG. 12 is a graph showing an example of a rate of change in a film thickness of a graphene film formed on a wafer in a case where there is no recoating process and in a case where there is a recoating process as in the second embodiment. In a graph 230 shown in FIG. 12, for the graphene film forming process on five wafers W, a graph 231 of the case where there is no recoating process and a graph 232 of the case where there is the recoating process to which the second embodiment is applied are shown. As shown in the graph 231, in the case where there was no recoating process, the film thickness of the graphene film tended to become thinner in the second to fifth wafers W, compared to the first wafer W. Meanwhile, as shown in the graph 232, in the case where there was a recoating process, there was almost no change in the film thickness of the graphene film, and the film thickness was constant in the five wafers W.

As described above, according to the first embodiment, the processing apparatus 100, which is a processing apparatus for forming a film with plasma, includes the processing container 101, the mounting table 102, and the controller 106. The processing container 101 has the ceramic sprayed coating 201 on an inner wall, on which an antenna that radiates microwaves is arranged, and accommodates a substrate (a wafer W). The substrate is mounted on the mounting table 102 in the processing container 101. The controller 106 performs the precoating process of coating a surface of the ceramic sprayed coating with the first carbon film 202 by the plasma of the first carbon-containing gas at the first pressure and performs the film forming process of forming the second carbon film on the substrate by the plasma of the second carbon-containing gas at the second pressure.

Further, according to the first embodiment, the first carbon film 202 and the second carbon film include one or more of a graphene film, an amorphous carbon film, and a diamond-like carbon film. As a result, the carbon etched from the first carbon film 202 may be consumed as a carbon film forming component of the second carbon film.

Further, according to the first embodiment, the first carbon-containing gas further contains nitrogen, and the first carbon film 202 is a nitrogen-containing carbon film. As a result, the insulating property of the first carbon film 202 may be improved. In addition, plasma damage to the top wall 111 may be reduced.

Further, according to the first embodiment, the first pressure is higher than the second pressure. As a result, it is possible to suppress deposition of carbon on the wafer W in the precoating process.

Further, according to the first embodiment, the ceramic sprayed coating 201 is a metal oxide film or a metal nitride film. As a result, the propagation of microwave energy on the inner wall of the chamber may be suppressed.

Further, according to the first embodiment, before the precoating process, the controller 106 performs the preprocessing process in which, with the plasma of the gas containing one or more of hydrogen and a noble gas, stabilized termination of oxygen or nitrogen of the ceramic sprayed coating 201 is performed. As a result, it is possible to stabilize variation points where an oxidation state or a nitriding state of the ceramic sprayed coating 201 is incomplete.

Further, according to the first embodiment, in the film forming process, the carbon dissociated from the first carbon film 202 etched by the plasma of the second carbon-containing gas contributes to the film formation along with the second carbon-containing gas. As a result, the generation of particles may be reduced.

Further, according to the second embodiment, after the film forming process, using the plasma of the first carbon-containing gas at the first pressure, the controller 106 performs the recoating process of replenishing the first carbon film 202 etched by the plasma of the second carbon-containing gas in the film forming process. As a result, the first carbon film 202 consumed in the film forming process may be replenished.

Further, according to the second embodiment, after the precoating process, the controller 106 repeatedly performs the annealing process of performing annealing treatment on the substrate and the film forming process and performs the recoating process after processing of one lot of substrates is completed. As a result, the first carbon film 202 consumed in the film forming process may be replenished in units of one lot.

Further, according to the second embodiment, after the precoating process, using the plasma of the first carbon-containing gas at the first pressure, the controller 106 performs a second recoating process of preliminarily replenishing the etching amount of the first carbon film 202 etched by the plasma of the second carbon-containing gas in the film forming process. After the second recoating process, the controller 106 performs the annealing process of performing annealing treatment on the substrate and the film forming process. As a result, stable particle suppression and film thickness control of the graphene film on the substrate may be performed.

Each embodiment disclosed herein should be considered as illustrative in all aspects instead of limiting. The above embodiments may be omitted, substituted, or modified in various forms without departing from the scope of the appended claims and the gist thereof.

Further, although a graphene film is formed on a wafer W in each of the above-described embodiments, the present disclosure is not limited thereto. For example, the above embodiments may also be applied to the case where an amorphous carbon film or a diamond-like carbon film is formed on a wafer W.

Further, although the processing apparatus 100 having the plurality of microwave radiation mechanisms 143 provided as microwave sources in the processing container 101 is used in each of the above-described embodiments, the present disclosure is not limited thereto. For example, a processing apparatus that radiates microwaves using a single planar slot antenna as a microwave source may also be used.

Further, although the plurality of gas introduction nozzles 123 are provided in the top wall 111 in each of the above-described embodiments, the present disclosure is not limited thereto. For example, a gas may be supplied via a shower plate provided above the mounting table in the processing container to partition the upper and lower portions.

DESCRIPTION OF REFERENCE NUMERALS

100: processing apparatus
101: processing container
102: mounting table
106: controller
111: top wall
111a: oxide film
112: sidewall
201: ceramic sprayed coating
202: first carbon film
207: second carbon film
P: plasma
W: wafer

The invention claimed is:

1. A film forming method for forming a film with a plasma, the film forming method comprising:
    a precoating process of coating a surface of a ceramic sprayed coating with a first carbon film with a plasma of a first carbon-containing gas at a first pressure in a state where a substrate is not carried into a processing container having the ceramic sprayed coating on at least one of an inner wall of a top wall on which an antenna that radiates microwaves is arranged and a side wall of the processing container, the top wall extending along a first direction and the side wall extending along a second direction that is different from the first direction;
    a mounting process of mounting the substrate on a mounting table in the processing container, the mounting table extending along the first direction; and
    a film forming process of forming a second carbon film on the substrate with a plasma of a second carbon-containing gas at a second pressure,
    wherein the first pressure during the precoating process is higher than the second pressure during the film forming process, and wherein at the first pressure the plasma of the first carbon-containing gas narrows toward the top wall of the processing container and at the second pressure the plasma of the second carbon-containing gas spreads towards the mounting table, and wherein a microwave transmission plate is arranged on a lower surface side of the antenna and is fitted in an opening in the top wall such that a lower surface of the microwave transmission plate is planar with a lower surface of the top wall.

2. The method of claim 1, wherein the first carbon film and the second carbon film include one or more of a graphene film, an amorphous carbon film, and a diamond-like carbon film.

3. The method of claim 1, wherein the first carbon-containing gas further contains nitrogen, and the first carbon film is a nitrogen-containing carbon film.

4. The method of claim 1, wherein the ceramic sprayed coating is a metal oxide film or a metal nitride film.

5. The method of claim 4, further comprising, before the precoating process, a preprocessing process in which, with a plasma of a gas containing one or more of hydrogen and a noble gas, stabilized termination of oxygen or nitrogen of the ceramic sprayed coating is performed.

6. The method of claim 1, wherein, in the film forming process, the first carbon film is etched by the plasma of the second carbon-containing gas and a first portion of carbon dissociated from the first carbon film etched by the plasma of the second carbon-containing gas contributes to the film formation along with the second carbon-containing gas and a second portion of the carbon dissociated from the first carbon film etched by the plasma of the second carbon-containing gas is exhausted from the processing container.

7. The method of claim 1, wherein, in the film forming process, the first carbon film is etched by the plasma of the second carbon-containing gas, the method further comprising:
    a carrying-out process of carrying the substrate out of the processing container after the film forming process; and
    a first recoating process of replenishing the first carbon film etched by the plasma of the second carbon-containing gas in the film forming process.

8. The method of claim 7, wherein, after the precoating process is performed, the mounting process, an annealing process of performing annealing treatment on the substrate, the film forming process, and the carrying-out process are repeated, and after processing of one lot of the substrates is completed, the first recoating process is performed.

9. The method of claim 1, further comprising, after the precoating process, a second recoating process in which, using the plasma of the first carbon-containing gas at the first pressure, an etching amount of the first carbon film etched by the plasma of the second carbon-containing gas in the film forming process is preliminarily replenished, wherein, after the second recoating process is performed, the mounting process, an annealing process of performing annealing treatment on the substrate, and the film forming process are performed.

* * * * *